(12) United States Patent
Lin et al.

(10) Patent No.: US 6,414,542 B2
(45) Date of Patent: *Jul. 2, 2002

(54) INTEGRATED CIRCUIT WITH RELATIVE SENSE INVERSION OF SIGNALS ALONG ADJACENT PARALLEL SIGNAL PATHS

(75) Inventors: Xi-Wei Lin, Fremont; Dipankar Pramanik, Saratoga, both of CA (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/271,933

(22) Filed: Mar. 17, 1999

(51) Int. Cl.[7] .............................................. H01L 25/00
(52) U.S. Cl. ...................................... 327/565; 326/101
(58) Field of Search ................................ 327/564, 565, 327/566, 141, 144; 326/101; 364/488, 489, 490, 491

(56) References Cited

U.S. PATENT DOCUMENTS

| | | | | |
|---|---|---|---|---|
| 4,404,663 A | * | 9/1983 | Saeki et al. .................. 365/205 |
| 5,306,967 A | * | 4/1994 | Dow ........................... 326/101 |
| 5,432,484 A | * | 7/1995 | Klas et al. ..................... 333/1 |
| 5,436,573 A | * | 7/1995 | Ogawa et al. ................. 326/17 |
| 5,936,302 A | * | 8/1999 | Pedersen et al. ............. 257/665 |
| 5,994,946 A | * | 11/1999 | Zhang ......................... 327/403 |
| 6,184,702 B1 | * | 2/2001 | Takahashi et al. ............ 326/21 |

* cited by examiner

Primary Examiner—Timothy P. Callahan
Assistant Examiner—Hai L. Nguyen
(74) Attorney, Agent, or Firm—Peter Zawilski

(57) ABSTRACT

The relative sense of parallel propagating signals is inverted so reduce maximum transit time and transit-time variance. An integrated circuit comprises adjacent parallel signal paths, each extending from a respective driver to a respective load. Each signal path includes sense-inverting buffers and sense-preserving buffers arranged so that each sense-inverting buffer on one signal line is immediately adjacent to a sense-preserving buffer of the neighboring signal path. Signals co-propagating along the two signal paths have their relative senses inverted at each inter-path pair of adjacent buffers. As a result the crosstalk-induced tendencies of same-direction transitions to accelerate transition and opposing-direction transitions to retard transitions compensate for each other. In this way, the arrangement of sense-inverting and sense-preserving buffers reduces the maximum propagation delay across the signal paths and reduces the variance in propagation delays. Accordingly, the integrated circuit can be designed for faster transmission speeds and more precise timing—and thus better performance. The invention provides that the signal paths can be on the same or different metal levels, and can be implemented with or without sense-preserving buffers.

15 Claims, 2 Drawing Sheets

INTEGRATED CIRCUIT WITH RELATIVE SENSE INVERSION OF SIGNALS ALONG ADJACENT PARALLEL SIGNAL PATHS

BACKGROUND OF THE INVENTION

The present invention relates to integrated circuits and, more particularly to a design for minimizing crosstalk between parallel signal paths in an integrated circuit. A major objective of the present invention is to provide for higher performance integrated circuits by minimizing crosstalk-induced propagation delays and crosstalk-induced variances in propagation times.

Much of modern progress is associated with advances in computer technology, which in turn has been made possible by continuing advances in integrated-circuit manufacturing technology. In particular, the increasing miniaturization of integrated-circuit features has made possible more functionality (as circuit density has increased) and greater speeds (in part because signal-path distances have diminished).

Integrated circuits typically comprise active elements, such as transistors, and an interconnect structure connecting the active elements to achieve the desired functionality. The interconnect structure includes metal conductors that are electrically isolated from each other, where necessary, by dielectric material such as silicon dioxide. As signals can weaken over long transmission distances, buffers (usually inverters) are often spaced along a signal path. As is well known, two metal layers spaced from each other by dielectric material form a capacitor. Accordingly, neighboring metal conductors separated by dielectric material are capacitively coupled.

The capacitive coupling between conductors can cause crosstalk, the mutual interference of two signals that are supposed to be independent. It can take the form of transitions in one signal (the "aggressor") causing artifacts in another signal (the "victim"); the interference can mask, distort, or otherwise disturb the intended form of the signal.

Crosstalk can also cause propagation delays. Computers often transmit information in binary form in which low and high logic levels are represented respectively by low and high voltages. Transitions between low and high voltages inherently take some time (in addition to the signal transit time from driver to receiver). If a parallel aggressor signal undergoes a transition in the opposite direction, the transition time for the victim signal increases. For example, if the aggressor signal transitions from 5 volts to 0 volts while the victim signal transitions from 0 volts to 5 volts, detection of the later transition will be delayed relative to a detection that would have occurred had there been no transition in the aggressor signal. In effect, the maximum propagation time is increased by the crosstalk. The performance of components relying on accurate detection of the victim signal must be limited to accommodate this crosstalk-induced propagation delay. Accordingly, overall circuit performance is impaired by crosstalk-induced propagation delay.

If the aggressor signal transitions in the same direction as the victim signal, the transitions are facilitated and propagation time is decreased. If a transition is detected sooner than expected, it can interfere with the intended reading of a previous signal level. Thus, the rate at which transitions are encoded into a signal must be kept low enough to ensure that the appropriate bit of information is being read. In other words, crosstalk increases the variance (or "timing uncertainty") of signal propagation—and overall circuit performance must be limited to ensure accurate readings.

In summary, crosstalk between extended parallel signal paths decreases circuit performance because: 1) the maximum propagation delay is increased; and 2) the variance of the propagation delay is increased. What is needed is a scheme for reducing the performance penalty attributable to such crosstalk.

SUMMARY OF THE INVENTION

The present invention provides for inverting the relative sense of parallel signals at least once during transit along their common extent so that the propagation time increases causes by opposing transitions is at least partially compensated by propagation time decreases caused by same-sense transitions.

For example, consider two parallel signals that undergo simultaneous low-to-high voltage transitions at the input to their respective parallel signal paths. Mid-way along the common extent of the paths, one of the signals is inverted while the other is not so that the transitions are now opposing. In this case, both signals will undergo a propagation time increase for the first half of the transmission and a propagation time decrease for the second half of the transmission. Ideally, the increase and decrease would be equal and there would be no variance in propagation times. However, the invention provides an advantage over the prior art even where the increase and decrease are not equal. More generally, the signals should have the same sense for at least one-third of the common path length and the opposite sense for at least a (different) one-third of the common path length.

Two signals have the same relative sense while they have their original senses and while both have a sense opposite their original senses. Two signals have different relative senses when one signal has its original sense and the other has the sense opposite its original sense. Similarly, two transitions have the same sense if they are both low to high or both high to low; two transitions have the opposite sense if one is low to high and the other is high to low.

The inversion can be achieved by inserting a sense-inverting buffer (an inverter) midway along one signal path but not along the other. In this case, the inverter would not only invert the relative sense but also introduce a phase delay. The phase delay would move time-aligned transitions out of time alignment. Their mutual influence would be reduced and thus, the compensation of propagation delay or advance would be reduced. Accordingly, it is preferable that the signal paths have the same number of buffers.

In a first realization of the invention, each sense-inverting buffer on a signal path is adjacent a sense-preserving buffer on an adjacent parallel signal path. The parallel signal paths can be on the same metal level or on different metal levels. Herein, signal paths are adjacent where there is no parallel signal path between them.

One signal path can have a sense-inverting buffer midway along its extent, while the second signal path can have a sense-preserving buffer adjacent to the sense-inverting buffer. Complementarily, the second signal path can also have a sense-inverting buffer adjacent to a sense-preserving buffer of the first signal path. Herein, a point or buffer A is "adjacent" to a point or buffer B, if it is nearer to B than to any driver, load, or other buffer on the same signal path as B. "Immediately adjacent" in this context means that a projection of A onto the path containing B intersects B.

In a second realization of the invention, parallel signal paths include only sense-inverting buffers, but they are staggered so that the inversions along the respective signal paths take place at different points along the common extent of the paths. While this alternative uses the same number of buffers for each signal path, the parallel signals go in and out of phase in a manner that limits compensation of crosstalk induced propagation variances. Thus, the first realization achieves higher performance at the cost of the inclusion of the sense-preserving buffers.

By inverting relative sense along with common extent of parallel signal paths, the maximum propagation delay is reduced, allowing faster circuit operation. Also, the variance in propagation delay is reduced, allowing more precise read timing and thus faster reads. Thus, the invention increases performance in two different ways. The performance advantages are achieved at minimal cost since only the sense of buffers is changed relative to the prior art—no additional circuit elements are required. These and other features and advantages are apparent from the description below with reference to the following drawings.

DESCRIPTION OF THE PREFERRED EMBODIMENTS.

Figure 1:
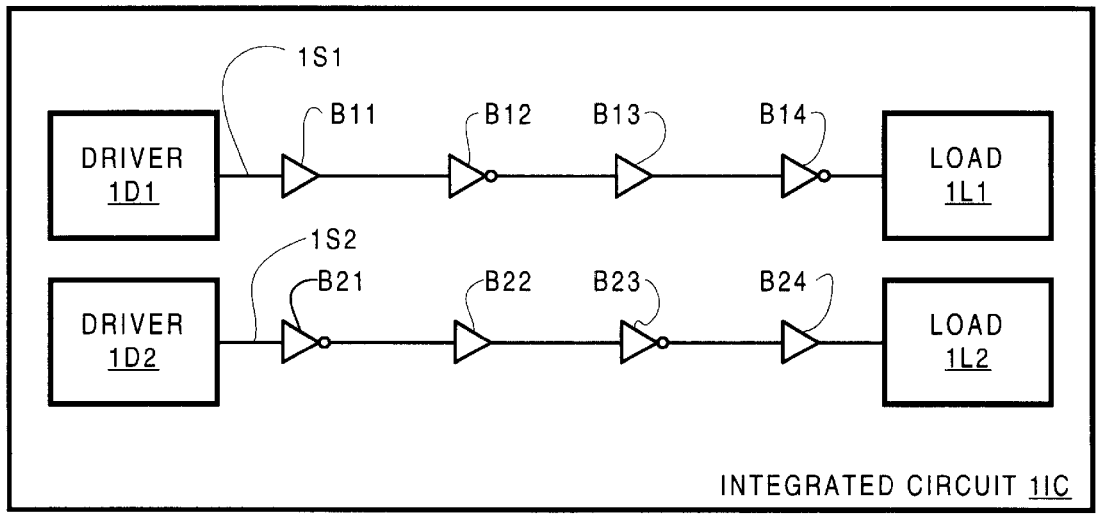
FIG. 1 is a circuit diagram of an integrated circuit incorporating sense-preserving buffers adjacent to sense-inverting buffers in parallel signal paths in accordance with the present invention.

An integrated circuit IC1 comprises parallel adjacent signal paths 1S1 and 1S2, as shown in FIG. 1. Signal path 1S1 extends on an upper metal level from a driver 1D1 to a load 1L1, while signal path 1S2 extends on a lower metal level from a driver 1D2 to a load 1L2. Each signal path 1S1 and 1S2 includes four buffers. Signal path 1S1 includes buffers B11, B12, B13, and B14. Signal path 1S2 includes buffers B21, B22, B23, and B24.

Buffers B12, B14, B21, and B23 are sense-inverting buffers (inverters serving as buffers), while buffers B11, B13, B22, and B24 are sense-preserving buffers. Sense-inverting buffer B21 of signal path 1S2 is adjacent to sense-preserving buffer B11; sense-inverting buffer B12 of signal path 1S1 is adjacent to sense-preserving buffer B22 of signal path 1S2. Sense-inverting buffer B23 of signal path 1S2 is adjacent to sense-preserving buffer B13 of signal path 1S1. Sense-preserving buffer B24 of signal path 1S2 is adjacent to sense-inverting buffer B14 of signal path 1S1. Thus, each sense-preserving buffer is adjacent to a sense-inverting buffer on the other signal path, and vice versa.

Buffers B11-B24 are designed so that they impose approximately equal delays on throughgoing signals. Accordingly, the phase relationships between signals transmitted along paths 1S1 and 1S2 are substantially maintained.

The relative-sense of the signals propagating along signal paths 1S1 and 1S2 is inverted each time they are buffered. For example, the signal propagating along signal path 1S2 is inverted by its first buffer B21, while signal propagating along signal path 151 is not inverted by its first buffer B11. Accordingly, since the signals are considered as having the same original sense as transmitted by drivers 1D1 and 1D2, they have opposing senses along the parallel path extents from buffer B11 to buffer B12 and from buffer B21 to buffer B22.

The signal propagating along signal path 1S1 is input to buffer B12 with its original sense. Buffer B12 is sense-inverting, so the signal has the sense opposite its original sense. The signal along signal path 1S2 input to buffer B22 has a sense opposite to its original sense; this opposite sense is preserved by sense-preserving buffer B22. Thus, both signals have a sense opposite to their original sense as they travel from buffers B12 and B22 to buffers B13 and B23. Accordingly, the signals have the same relative sense along this extent.

The relative sense is opposite again along the extent from buffers B13 and B23 to buffers B14 and B24. The relative sense is the same again along the extent from buffers B14 and B24 to loads 1L1 and 1L2. Thus, the relative senses are the same over the initial, middle, and end segments of the signal paths, and inverted over the second and fourth segments. So that the signals spend the same amount of time having opposite relative senses as they do having the same relative sense, the signal path segments at the driver and load ends are half as long as the segments that extend between buffers.

In a variation of integrated circuit IC1, the signal path segments connected to drivers 1D1 and 1D2 and loads 1L1 and 1L2 are the same length as the other segments. In this case, compensation is less than ideal since the signals spend more time having the same relative sense than having opposing senses.

In another variation, an odd number of buffers is used for each signal path. One signal path has an odd number of sense-inverting buffers and an even number of sense-preserving buffers; the other signal path has an even number of sense-inverting buffers and an odd number of sense-preserving buffers. In this case, optimal compensation can be achieved with equal segment lengths. However, the signals are received with opposing senses.

More generally, the invention can provide for any number of parallel signal paths. Also, any number of buffers can be accommodated for a signal path. Preferably, the number of buffers for a signal path is chosen to minimize propagation delays when neighboring signal paths are quiescent. The invention is then applied to minimize propagation delays and variance in non-quiescent conditions.

The invention does not require that the same number of buffers be used for each signal path. Typically, however, parallel signal paths should employ the same pitch for arranging buffers to maintain phase relations. When the numbers of buffers are equal over entire signal paths or over some common extent, four cases can be distinguished: 1) the number is divisible by four; 2) the number leaves a remainder of one when divided by four; 3) the number leaves a remainder of two whendivided by four; and 4) the number leaves a remainder of three when divided by four.

Where (case 1, e.g., integrated circuit IC1) the common number of buffers is four or a multiple thereof, the number of sense-inverting buffers can be even and equal to the number of sense-preserving buffers. In this case, signals exit the signal paths (or common extents thereof) with their original senses. To equalize the times spent with the same relative sense and with the opposing relative sense, end segments can be half as long as intermediate signal path segments.

Where (case 3), dividing the number of buffers by four leaves a remainder of two, the number of sense-inverting buffers can be odd and equal to the number of sense-preserving buffers per signal path. In this case, signals exit the signal paths with the senses opposing their original sense, but with the same relative sense. To equalize the times spent with the same relative sense and with the opposing relative sense, end segments can be half as long as intermediate signal path segments.

Where (case 2), dividing the number of buffers by four leaves a remainder of one, the numbers of sense-inverting buffers and sense-preserving buffers are different for adjacent signal paths. In one signal path in each signal path pair, the number of sense-inverting buffers is even (so that the original sense is restored as the path is exited) and one less than the number of sense-preserving buffers. In the other signal path of the pair, these numbers are reversed so that the original sense of the signal is not restored as it exits the signal path. Accordingly, the receiving logic must take into account the alternating senses of signals received along respective odd and even signal paths. Propagation delay and variance can be minimized using equal path segment lengths throughout the signal paths.

Where (case 4), dividing the number of buffers by four leaves a remainder of three, the situation is much the same as case 2. However, the paths with the larger number of sense-inverting buffers have an even number of such buffers—so that the original sense is restored at the path exit. Complementarily, the paths with the lesser number of sense-inverting buffers exit their signals with a sense opposite the original sense. Once again, the receiving logic must take the alternating relative senses into account.

Figure 2:
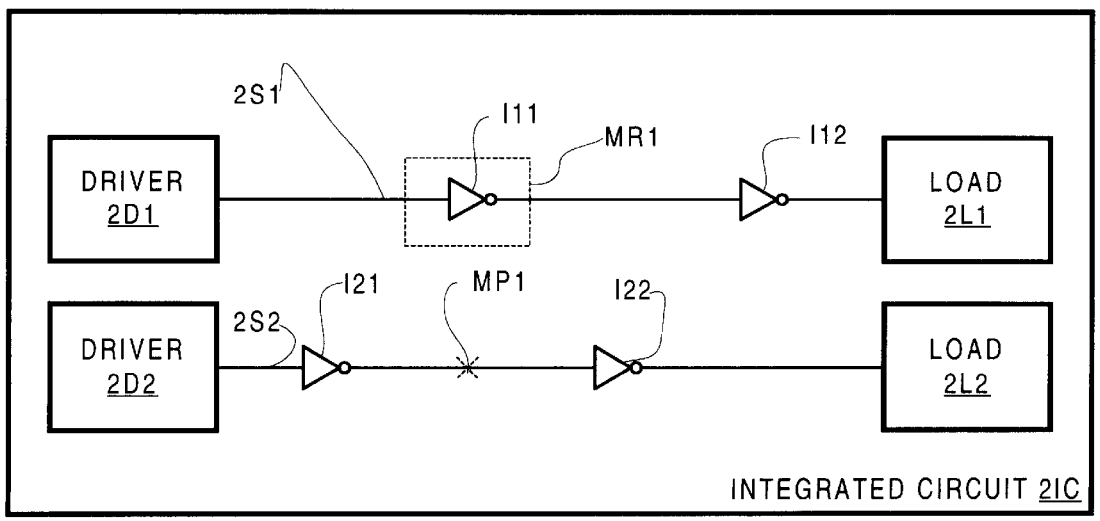
FIG. 2 is a circuit diagram of another integrated circuit staggered sense-inverting buffers on parallel signal paths in accordance with the present invention.

The invention also provides for omitting sense-preserving buffers. Accordingly, integrated circuit 2IC comprises two signal paths 2S1 and 2S2 using only sense-inverting buffers, as shown in FIG. 2. (Integrated circuit 2IC is essentially integrated circuit 1IC with its sense-preserving buffers removed.) Starting at driver 2D1 and ending at load 2L1; signal path 2S1 includes two sense-inverting buffers I11 and I12 and no sense-preserving buffers. Starting at driver 2D2 and ending at load 2L2, signal path 2S2 includes inverting buffers I21 and I22 and no sense-preserving buffers. However, propagation compensation is non-optimal since the signals along paths 2S1 and 2S2 have their original phase relationship only when they have the same relative phase.

The advantages of integrated circuits 1IC and 2IC are indicated in the following table, which indicates Hspice simulations of propagation delays of a 1 cm metal 3 net.

| Buffer Configuration | Propagation Delay (ns) | | | Variance |
| --- | --- | --- | --- | --- |
| | In Phase | Quiescent | Opposite | Δt (ns) |
| Unstaggered Sense-Inverting Buffers (Prior Art) | 0.81 | 1.13 | 1.57 | 0.76 |
| Staggered Sense-Inverting Buffers (2IC) | 1.19 | 1.25 | 1.4 | 0.21 |
| Alternating Buffers (1IC) | 1.05 | 1.08 | 1.23 | 0.18 |

Note that both illustrated embodiments of the invention have lesser maximal propagation delays; the maximum delays occur when neighboring signals undergo opposite transitions. In this case, a prior art system with four sense-inverting buffers per signal path arranged in a non-staggered fashion between neighboring signal paths incurs a maximum propagation delay of 1.57 nanoseconds (ns). Integrated circuit 2IC of FIG. 2 reduces this to 1.4 ns, while the preferred embodiment of FIG. 1 reduces this to 1.23 ns. In addition, the embodiments of the invention reduce the prior art variance of 0.76 ns to 0.21 ns and 0.18 ns respectively.

Figure 3:
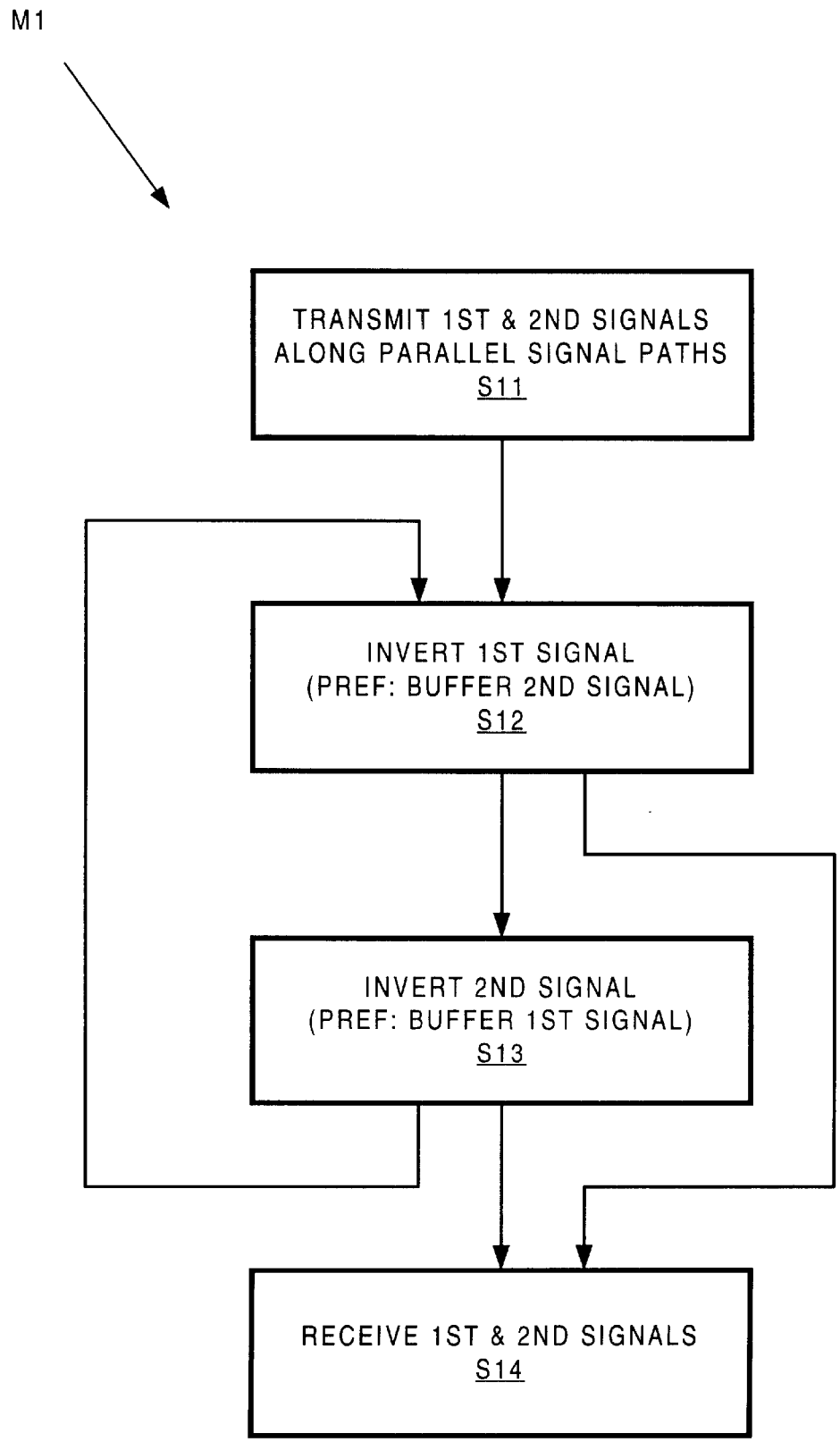
FIG. 3 is a flow chart of a method of the invention practiced in the context of the integrated circuits of FIGS. 1 and 2.

A method M1 of the invention is flow-charted in FIG. 3. Two signals are transmitted at step S11 along parallel signal paths. In this case, we can assume that the signals involve concurrent transitions. One of the signals is inverted at step S12, while the other is not. To the extent that the inverted signal incurs a phase delay, it is preferable that the uninverted signal be subjected to an equal delay, e.g., imposed by a sense-preserving buffer.

If there is only one buffer per signal path, method M1 ends as the signals are received at step S14. If there are more than one buffer per signal path, method M1 proceeds from step S12 to step S13.

Step 13 is the same as step S12 except that the signal that was not inverted in the previous step is inverted in this step. Likewise, the signal that was inverted in the previous step, is not inverted in this step. Thus, the original relative sense is restored. If the buffers involved in step S13 are the last buffers in the signal paths, method M1 ends at step S14 with the signals being received with their original relative sense restored. Otherwise, method M1 returns to step S12.

In general, method M1 involves iterating steps S12 and S13 until the signals are received. If the number of inversions is even, method M1 ends with a transition from step S12 to step S14 and the signals are received with their original relative sense restored. If the number of inversions is odd, method M1 ends with a transition from step S13 to step S14 and the signals are received with opposing relative senses.

In the illustrated embodiments, the signal paths are on different metal levels. However, the invention applies also when the signal paths are on the same metal levels. Moreover, the invention can be applied in integrated circuits where parallel signal paths are both on the same level and on different levels. For example, a parallel set of signal paths on one level can be parallel to a similar set of signal paths on an adjacent metal level.

In general, it is recognized that some compensation is better than no compensation. The invention thus provides for non-optimized embodiments. For example, a sense-inverting buffer of one signal path is optimally located immediately adjacent to a sense-preserving buffer (or a point MP1, FIG. 2, midway between two sense-inverting buffers) of a neighboring signal path. (Here, "immediately adjacent" signifies "at the point of the neighboring path closest to the sense-inverting buffer".) However, some deviation from optimal placement can provide for substantial practical improvement over the prior art.

Accordingly, the present invention provides some latitude in placement of buffers, e.g., within a range MR1 coextensive with the "middle half" (i.e., second and third fourths) of the segment extending between two successive inverters (e.g., I21 and I22) along a signal path (e.g., 2S2). The invention does not require placement at the closest point, but at any point that is closer to the closest point that to any other sense-inverting buffer on the same signal path—"adjacent" is used herein to signify this condition. In general, each relative phase should be in force for at least one quarter of the total common path length. These and other variations upon and modifications to the described embodiments are provided for by the present invention, the scope of which is defined by the following claims.

What is claimed is:

1. An integrated circuit comprising:
   a first signal path extending from a first node to a second node, said first signal path being segmented in line sections by, and including, a first sense-inverting buffer disposed between said first node and said second node; and a second signal path adjacent and parallel to said first signal path, said second signal path being segmented in line sections by, and including, a first sense-preserving buffer disposed closer to said first sense-inverting buffer than to either of said first node and said second node, neither the first sense-inverting buffer nor the first sense-preserving buffer contributing significant propagation delay due to transmission line length, relative to propagation delay in one of said line sections of the first and second signal paths.

2. An integrated circuit as recited in claim 1 wherein said first sense-preserving buffer is immediately adjacent said first sense-inverting buffer.

3. An integrated circuit as recited in claim 1 wherein said first signal path is on a first metal level and said second signal path is on a different metal level.

4. An integrated circuit as recited in claim 3 wherein said first signal path also includes a second sense-preserving buffer and said second signal path also includes a second sense-inverting buffer, said second sense-inverting buffer being immediately adjacent to said second sense-preserving buffer.

5. The integrated circuit of claim 1, wherein the first sense-inverting buffer is not staggered relative to the first sense-preserving buffer.

6. The integrated circuit in claim 1, wherein the first sense-preserving buffer is dispose closer to the first sense-inverting buffer than any other portion of the second signal path.

7. The integrated circuit of claim 1, wherein the first signal path extends between a first driver and a first load, wherein the second signal path extends between a second driver and a second load and wherein the length of the first signal path between the first driver and a first buffer electrically coupled directly to the first driver is substantially equal to a length of the second signal path between the second driver and a first buffer electrically coupled directly to the second driver.

8. The integrated circuit of claim 1, wherein the length of the signal path between the first load and a last buffer electrically coupled directly to the first load is substantially equal to a length of the second signal path between the second load and a last buffer electrically coupled directly to the second load.

9. A method of conveying first and second signals along respective ones of two adjacent parallel signal paths having a common extent and being defined by lines sections, said signals having respective senses, said method comprising the steps of:

using at least one sense-inverting buffer and inverting at least once the sense of at least one of said signals as it traverses its respective signal path so that said signal have the same sense for at least one-quarter of said common extent and so that said signal have opposing senses for at least one-quarter of said common extent; and each time one of said signals is inverted by a sense-inverting buffer, buffering the other signal using an adjacent sense-preserving buffer without contributing significant propagation delay due to transmission line length, relative to propagation delay in said line sections.

10. The method of claim 9 wherein said sense-preserving buffer immediately adjacent said sense-inverting buffer.

11. The method of claim 9, wherein conveying the first and second signals includes maintaining the phase relationship between the first and second signals substantially closer along the path than would be maintained, were the sense-inverting and sense-preserving buffer staggered.

12. The method of claim 9 wherein a first one of the two adjacent parallel signal path is on a first metal level and a second one of the two adjacent parallel signal paths is on a different metal level.

13. The method of claim 12 wherein said firsrt signal path also includes a second sense-preserving buffer and said second signal path also includes a second sense-inverting buffer, said second sense-inverting buffer being immediately adjacent to said second sense-preserving buffer.

14. An integrated circuit comprising:
a first signal path extending from a first driver node to a first load node, said first signal path being segmented in line sections by, and including, a plurality of buffers including at least one sense-inverting buffer disposed between said first driver node and said first load node; and
a second signal path adjacent and parallel to said first signal path and extending from a second driver node to a second load node, said second signal path being segmented in line sections by, and including, a plurality of buffers including at least one sense-preserving buffer disposed between said first driver node and said first load node, each of said line sections in said first signal path being substantially equal in length to each of said line sections in said second signal path.

15. The integrated circuit of claim 14, wherein each of the plurality of buffers in said first signal path is immediately adjacent to a corresponding buffer in said second signal path.

* * * * *